United States Patent [19]

Hattori et al.

[11] Patent Number: 4,851,097
[45] Date of Patent: Jul. 25, 1989

[54] APPARATUS FOR REPAIRING A PATTERN FILM

[75] Inventors: Osamu Hattori; Anto Yasaka; Yoshitomo Nakagawa; Mitsuyoshi Sato; Sumio Sasaki, all of Tokyo, Japan

[73] Assignee: Seiko Instruments Inc., Tokyo, Japan

[21] Appl. No.: 138,360

[22] Filed: Dec. 24, 1987

[30] Foreign Application Priority Data

Dec. 26, 1986 [JP] Japan .................................. 61-315263
Oct. 23, 1987 [JP] Japan .................................. 62-268678

[51] Int. Cl.⁴ .............................................. B23K 15/00
[52] U.S. Cl. .......................... 204/192.33; 204/192.34; 204/298; 156/345; 156/626; 156/627; 156/635; 156/643; 250/492.1
[58] Field of Search ...................... 204/192.33, 192.34, 204/298; 156/626, 627, 635, 643, 345; 250/492.1, 492.2, 492.3

[56] References Cited

U.S. PATENT DOCUMENTS 4,609,809 9/1986 Yamaguchi et al. ......... 219/121 EM
4,698,236 10/1987 Kellogg et al. ................. 427/43.1

OTHER PUBLICATIONS

M. W. Geis et al., *J. Vac. Sci. Technol.*, vol. 19, pp. 1390-1393 (1981).
S. Hosaka et al., *J. Vac. Sci. Technol.*, vol. 16, pp. 913-917 (1979).
WO-A-8 602 774 (Ion Beam Systems), Publication date May 9, 1986.
*Journal of Vacuum Science & Technology/B*, vol. 3, No. 1, second series, Jan./Feb. 1985, pp. 67-70, Woodbury, N.Y., U.S.; Y. Ochiai, et al.: "Pressure and Irradiation Angle Dependence of Maskless Ion Beam Assisted Etching of GaAs and Si".

*Primary Examiner*—Aaron Weisstuch
*Attorney, Agent, or Firm*—Spensley, Horn, Jubas & Lubitz

[57] ABSTRACT

The present invention relates to an apparatus for repairing a pattern film of a photomask, reticle, X-ray mask, semiconductor, etc. In the apparatus, a focused ion beam is applied to an excess portion of a pattern film which is formed on a substrate. The excess portion of the pattern film is removed by means of ion sputtering. For repairing an excess portion of the pattern film, an etching gas is provided to a position that is being irradiated with the scanning focused ion beam thereby increasing the reliability of repairing and carrying out repair of the excess portion of the pattern film with good quality. Further, the removal speed of the excess portion film is improved.

19 Claims, 4 Drawing Sheets

APPARATUS FOR REPAIRING A PATTERN FILM

BACKGROUND OF THE INVENTION

This invention relates to an apparatus for repairing a pattern film of a photomask, a reticle, semiconductor, etc.

FIG. 2 shows a conventional apparatus for repairing a pattern film. Ions, which are generated from an ion source 1, pass through an ion optical system including a focusing lens 2 and an objective lens 3 and are formed into a focused ion beam 5 having a predetermined radius (of not more than 1 micrometer). The focused ion beam 5 passes through a scanning electrode 4 and scans across a surface of a sample 6.

An excess portion of a pattern film formed on the surface of the sample 6 is positioned directly below the focused ion beam by moving an XY stage 7 on a basis of preset data and/or secondary charged particles 8 emitted from the surface of the sample by the irradiation with the scanning focused ion beam 5 which secondary charged particles are detected by means of a secondary charged particle detector 9. The output from the secondary charged particle detector 9 passes through an electronic circuit such as an A/D converter 10 so that a pattern of detected secondary charged particles 8 is displayed on a display device 11. The displayed pattern is observed and recognized by the naked eye, and then the sample 6 is moved by controlling the XY stage 7 so that the excess portion of the pattern film comes within the focused ion beam 5 scanning range.

The position and the range of the excess portion of the pattern film is defined by the display of the display device 11, and then the range of the excess portion of the pattern film is irradiated with the scanning focused ion beam by controlling the scanning electrode 4 and/or blanking electrode 12 (i.e., deflecting the ion beam out of the sample so that it will not reach the sample). In this way, only the excess portion of the pattern is repeatedly irradiated with the scanning focused ion beam so that the excess portion of the pattern film is removed by means of sputtering (sputter etching) effected by ions.

The fact, that in the conventional photomask repairing apparatus, an opaque defect is repaired (removed) by means of sputtering (sputter etching) with a scanning focused ion beam alone, causes the following problems. When an opaque defect on a photomask is repaired by sputter etching alone, gallium remains on the surface of the substrate due to irradiation by the scanning focused ion beam (gallium ions in most cases) and the transparency of the repaired portion of the opaque defect is reduced. Additionally, the surface repaired by means of sputter etching is not perfectly smooth so that it reflects light diffusively, and thus the transparency of the repaired portion of the opaque defect is reduced. In addition to the above, when a pattern film is a multi-layered film of chrome and chrome oxide, the boundary layer between the substrate and a chrome layer or a chrome oxide layer or a chrome layer and a chrome oxide layer changes the intensity of the secondary charged particles so that it is difficult to judge when an opaque defect repair is completed. Because this happens, an opaque defect repair may not be completed or may continue until unwanted damage of the substrate may be caused. Thus, the reliability of opaque defect repair is not high. Further, the material of a pattern film formed on a substrate and subjected to sputter etching is sputter-deposited on the rise portion formed at the removed area of the pattern film or on the periphery thereof. This results in the problem that the sharpness of the sputter etched edge is degraded.

BRIEF SUMMARY OF INVENTION

This invention concerns an apparatus for repairing a pattern film. Said apparatus comprises an ion source, an ion lens system for forming said ions into a focused ion beam, a scanning electrode system adapted to irradiate a sample with a focused ion beam while scanning said sample with said focused ion beam, a secondary charged particle detector for detecting secondary charged particles emitted from the surface of said sample, an image display device for displaying a pattern being formed on said sample surface on the basis of the planar intensity distribution of said secondary charged particles, an evacuation system for placing said ion source, said ion lens system, said scanning electrode system and said image display device in a vacuum, and means for removing an excess portion of said pattern through a sputtering effect by selectively irradiating the excess portion of said pattern with the scanning focused ion beam while repeatedly scanning said excess portion with said scanning focused ion beam. Said apparatus is further characterized by having a gas injector for providing an etching gas to the excess portion of said pattern, said gas injector comprising a nozzle for directing an etching gas against said excess portion, to thereby remove the excess portion of the pattern film. The excess portion may be an opaque defect of a photomask or reticle, or an excess portion of a pattern film of a semiconductor (IC, LSI etc.).

The invention is to obtain the following results by irradiating a scanning focused ion beam and an etching gas onto an excess portion of a pattern film which excess portion is to be removed. When chlorine is used as the etching gas, chlorine reacts with gallium ions in the irradiated ion beam and they form volatile gallium chloride so that no gallium remains on the sample. In repair of a photomask, the transparency of the repaired portion of the opaque defect is improved. The etched surface becomes perfectly smooth (referred to as smooth surface etching hereinafter) by using an etching gas so that the reduction of the transparency caused by diffused light does not occur, since the etching gas assisted by ions reacts with the material of the excess portion of the pattern film and does not react with the substrate and the other portion of the pattern film which is not irradiated with the scanning focused ion beam.

Further, when secondary ions emitted from the surface of the sample are detected by the secondary charged particle detector, without regard to whether a pattern film consists of an oxide like layered film or not, when any element to be detected exists, the secondary ion intensity of said element is stabilized at a high level by using an etching gas such as chlorine. Thus, it becomes easier to judge when a repair is completed and the reliability of the repair of the pattern film is improved. Without deteriorating the vacuum condition, the excess portion of the pattern film can be steadily repaired by means of an etching gas applied only locally to the excess portion of the pattern film, while supply of the etching gas is controlled.

It is an object of the invention to provide an apparatus for increasing operational speed of a pattern repairing.

Another object of the invention is to provide an apparatus for cleaning to the extent that no gallium or no atom of an ion remains.

A further object of the invention is to provide an apparatus for easily monitoring an end point of a repairing.

DETAILED DESCRIPTION OF THE INVENTION

One embodiment of the present invention will be described hereunder in detail with reference to the drawings.

Figure 1:
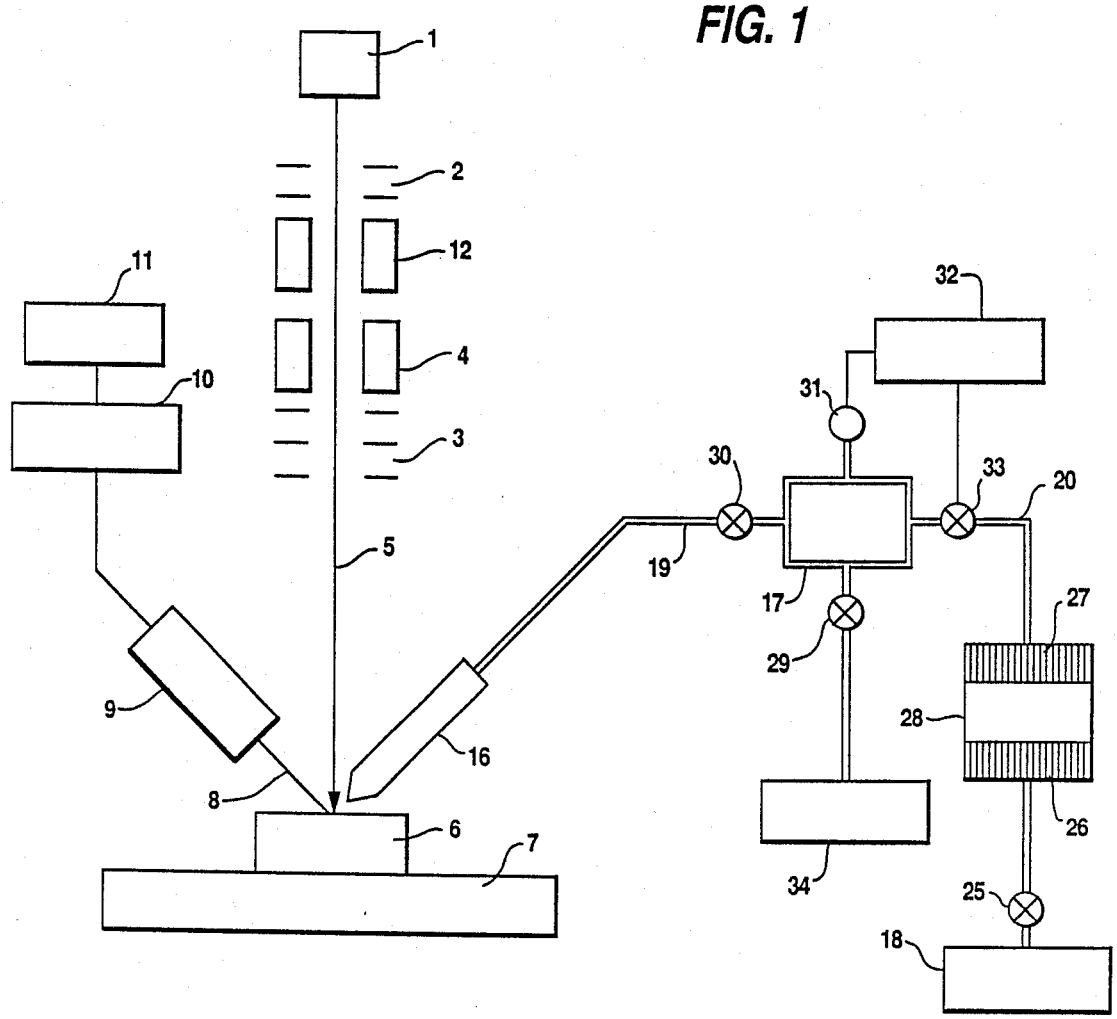
FIG. 1 shows the general arrangement of the apparatus according to the present invention.

FIG. 1 shows an apparatus for repairing a pattern film according to the present invention. Numeral 1 is an ion source for generating ions. The ion source 1 is, for example, liquid-metal gallium in this embodiment. Ions generated from ion source 1 pass through an ion optical system including a focusing lens 2 and an objective lens 3 and are formed into a focused ion beam 5. Numeral 4 is a scanning electrode to which a scanning voltage is applied. The focused ion beam 5 irradiates a sample 6 while scanning across a surface of the sample 6 by passing through the scanning electrode 4. The sample 6 is, for example, a photomask, a reticle, an X-ray mask or a semiconductor such as an IC and a LSI. In this embodiment, the sample 6 is a photomask comprising a transparent substrate of glass and a chromium pattern film formed on the substrate. Secondary charged particles 8 are emitted from the surface of the sample 6 when irradiated with the scanning focused ion beam 5. In this embodiment, the secondary charged particles are silicon ions from the substrate material or chromium ions from the pattern film material. Alternatively, the secondary charged particle 8 can be secondary electrons. Numeral 9 is a secondary charged particle detector for detecting the secondary charged particles 8. The above system is placed, by means of an evacuation system (not illustrated in the drawings), under a vacuum condition in which the pressure is not more than $10^{-4}$ Torr.

Numeral 10 is an A/D converter for converting the secondary charged particle signals detected by the secondary charged particle detector 9. The output from the A/D converter 10 is displayed by means of an image display device 11. Patterns on the sample 6 can be displayed by synchronizing the scanning of the focused ion beam 5 with the display of the scan by means of the image display device 11.

Numeral 7 is an XY stage in which the sample 6 is placed, thus rendering it movable in the X and Y directions. On the basis of preset position data, the XY stage 7 can be moved to the desired position so that a portion of the pattern film of the sample 6 to be repaired comes within the focused ion beam scanning range.

Numeral 12 is a blanking electrode. When unwanted damage to the sample 6 is not desired to be caused by irradiating the surface of the sample 6 with the scanning focused ion beam 5, blanking voltage should be applied to the blanking electrode 12 so that the scanning focused ion beam 5 is deflected and, therefore, does not irradiate the surface of the sample 6.

Figure 3:
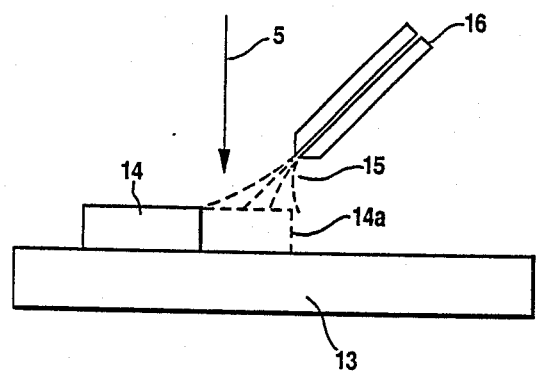
FIG. 3 is a sectional view for explaining an opaque defect repair.
Figure 2:
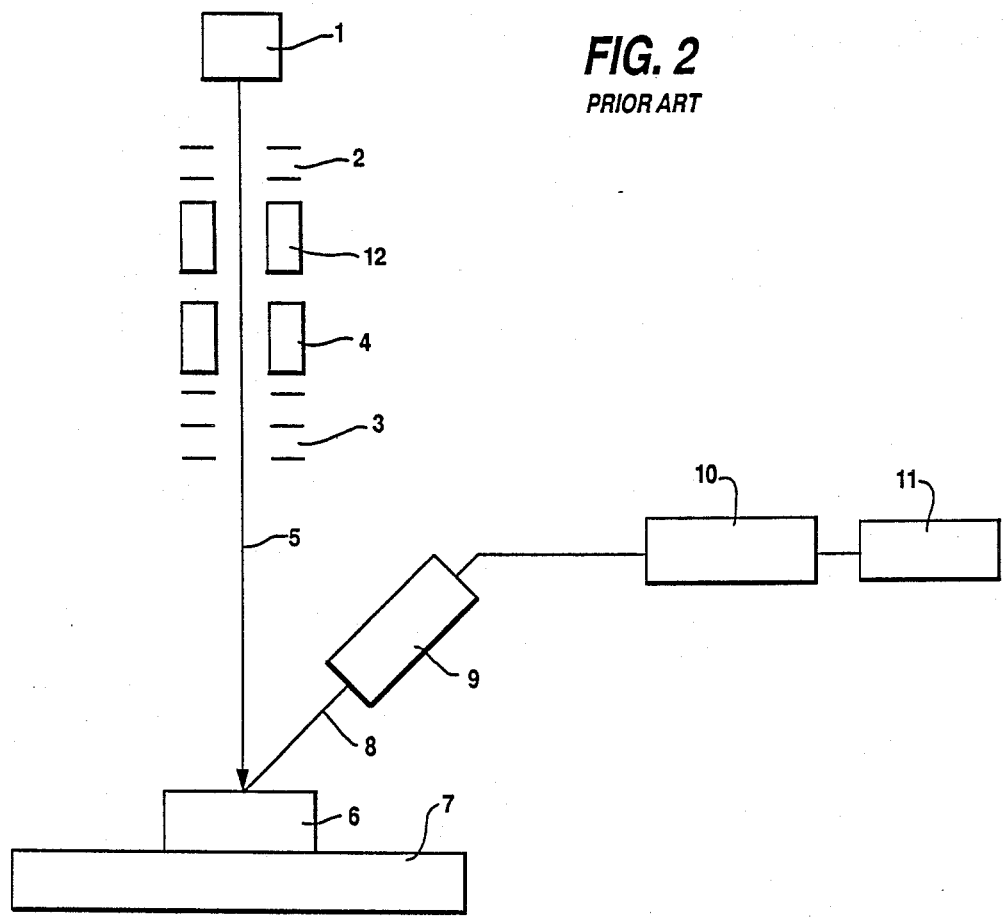
FIG. 2 shows the general arrangement of a conventional apparatus.

FIG. 3 is a sectional view of an example of the repair of an opaque defect of the photomask. The sample 6 comprises a glass substrate 13 and a pattern film 14 of chromium or molybdenum silicide having an excess portion 14a which is a so-called opaque defect. The pattern film 14 and the excess portion 14a of the film 14 are formed on the substrate 13. The excess portion 14a of the pattern film 14 is to be removed by means of the present apparatus. In repairing the opaque defect by removing the excess portion 14a, the range of scanning of the focused ion beam is set to correspond to the excess portion 14a and the scanning focused ion beam 5 is repeatedly irradiated only on the excess portion 14a of the pattern film 14. An etching gas 15, which is chlorine in this embodiment, is locally directed onto the excess portion 14a through a thin-tubed nozzle 16.

The etching gas of chlorine has a smooth surface etching effect on the repaired portion of the opaque defect and operates such that remains from the process such as gallium are not left on the surface, since the etching gas reacts with gallium and does not remain on the substrate 13. Further, the etching gas 15, at the excess portion, is activated by the focused ion beam 5 and reacts with the material of the excess portion 14a. Thus, speed of removal of the excess portion material is increased and the material is not deposited, by sputtering, around the excess portion 14a, since the material removed from the excess portion 14a reacts with the etching gas. Since the etching gas 15 outside of the excess portion 14a is not irradiated with the focused ion beam 5, it is not activated by focused ion beam 5, and does not react with the material of the pattern film. The etching gas 15, even if activated by the focused ion beam 5 at the excess portion, does not react with the glass material 13. Therefore, the removal of the excess portion film 14a is achieved cleanly and completely. The excess portion 14a film may not only be of a photomask or an X-ray mask but may also be of a semiconductor.

Chlorine has also an effect which increases the quantity of the secondary ions emitted from the surface of the sample 6 by irradiation with the ion beam so that it becomes easier to judge when the opaque defect repair is completed. Thus, the reliability of the opaque defect repair is improved.

The gas injector illustrated in FIG. 1 comprises a nozzle 16 for directing the etching gas onto the excess portion, a control chamber 17, a reservoir 18, pipes 19 and 20, a regulator 25, filters 26 and 27, a desiccant 28, valves 29 and 30, a vacuum gauge 31, a pressure controller 32, a variable flow quantity valve 33 and vacuum pump 34. The reservoir 18 is, for example, a gas cylinder filled with the etching gas 15. When the reservoir 18 is the gas cylinder, the etching gas 15 flows into the pipe 20 through the regulator 25 for reducing the gas pressure of the gas flow from the regulator 25. The pipes 19 and 20 are, for example, stainless steel tubes of ¼ inch diameter. The etching gas 15 flows out of the regulator 25 into the variable flow quantity valve 33 through the filters 26 and 27 and desiccant 28. The desiccant 28 functions to remove water contained impurities in the etching gas 15 and water left on the inside of pipes 19 and 20. If the etching gas contains water when used as described above, the water molecules adhere to the portion of the opaque defect being repaired. As a consequence, the etching process is disturbed by the adhered water molecules.

The desiccant 28 must be chemically stable against the etching gas 15. If the desiccant 28 is not chemically stable against the etching gas 15 and the desiccant 28 reacts with the etching gas 15, impurities causes by the reaction are mixed in the etching gas 15 as an impurity. Such an impurity disturbs the process of the opaque defect repair. In the case where the etching gas 15 is chlorine, the desiccant 28 is, for example, magnesium perchlorate. Obviously, the specific desiccant 28 employed should be selected relative to the particular etching gas 15 to be employed.

The filters 26 and 27 consist of a porous material for admitting only the etching gas 15 and for filtering out dust. The filters 26 and 27 also prevent any powder from the desiccant 28 from reaching variable flow quantity valve 33 and the regulator 25 thereby disturbing their functions by blocking the variable flow quantity valve 33. The pressure of the etching gas 15, which flows into the control chamber 17 through the variable flow quantity valve 33, is controlled in the control chamber 17. The etching gas 15 is directed through the valve 30 and the nozzle 16 into position to be irradiated with the scanning focused ion beam 5. Specifically, is to the position of the opaque defect which is being repaired.

The pressure in the control chamber 17 is controlled as follows. The pressure in the control chamber 17 is detected by the vacuum gauge 31 connected to the control chamber 17. Pressure signals are transmitted from the vacuum gauge 31 to the pressure controller 32. On the basis of the signals transmitted from the vacuum gauge 31, the pressure controller 32 calculates the difference between the pressure in the control chamber 17 and a predetermined pressure value, and the variation of the pressure in the control chamber 17 per unit hour. The pressure controller 32 then transmits to the variable flow quantity valve 33 a signal for keeping the pressure in the control chamber 17 at the predetermined pressure value. The variable flow quantity valve 33 varies the flow of gas in response to the signals transmitted from the pressure controller 32 so that the quantity of the etching gas, which flows into the control chamber 17, is controlled. The purpose of controlling the pressure in the control chamber 17 is to control the flow quantity of the etching gas 15, which is blown from the nozzle 16. When the flow quantity of the etching gas, which is blown from the nozzle 16, is small, the reaction between the etching gas 15 and the material of the pattern film or the ions does not proceed to the desired extent. When the flow quantity of the etching gas 15 from the nozzle 16 is large, the life of the ion source 1, the secondary charged particle detector 9, etc. becomes shorter. The optimum pressure in the control chamber 17 varies in response to factors such as the diameter or the length of the nozzle 16, but is fixed between $1 \times 10^{-3}$ and $2 \times 10^{-1}$ Torr for repairing opaque defects.

Vacuum gauges, which are generally used are, for example, an ionization-type or a thermocouple-type, which are not suitable for measuring the pressure in the control chamber 17 when the etching gas is a corrosive gas such as chlorine. This is because both the ionization-type gauge and the thermocouple-type gauge heat a filament in the gauge itself, which filament then reacts with the etching gas 15. Over time, these gauges become incapable of measuring precisely. In addition to the above problems, the products generated by the reaction of the filament with the etching gas 15 appear as impurities in the etching gas and disturb repair of the opaque defect. Accordingly, the gauge 31, to be used in this embodiment, must be of a diaphragm-type or of a spinning rotor-type. The diaphragm-type vacuum gauge detects the pressure by detecting the displacement of a metal diaphragm possessing high corrosion resistance. Thus, the detected pressure value does not change over time and does not cause a reaction which generates impurities which appear in the etching gas. The spinning rotor-type vacuum gauge detects pressure by utilizing the fact that variation in the speed of rotation of a magnetically floating steel ball is proportionate to the pressure in which the steel ball is placed. Again, the detected pressure value does not change over time and does not cause a reaction which generates impurities which appear in the etching gas 15. The vacuum gauge 31 is, for example, a Baratron vacuum gauge manufactured in Japan by MSK Co. Ltd.

The valve 30 is opened when the etching gas 15 is to be blown from the nozzle 16, and is closed when the etching gas 15 is not to be blown from the nozzle 16.

The vacuum pump 34 is to evacuate the air which flows into the pipes when the reservoir is exchanged or installed and is to evacuate the gas admitted through the wall of the control chamber 17, etc. The control chamber 17 is evacuated by the vacuum pump 34 by means of opening or closing the valve 29. The partial pressure of any impurity gas in the control chamber 17 is kept at 1% or less of the partial pressure of the etching gas 15. When the vacuum pump 34 is of the rotary or oil diffusion-type, oil exhaled from the pump flows into the control chamber 17 as an impurity gas or reacts with the etching gas 15 and disturbs the repair of the opaque defect. So the vacuum pump 34 must be of the turbo-molecular, or cryo or mercury diffusion-type which generates no impurity gas.

Figure 4:
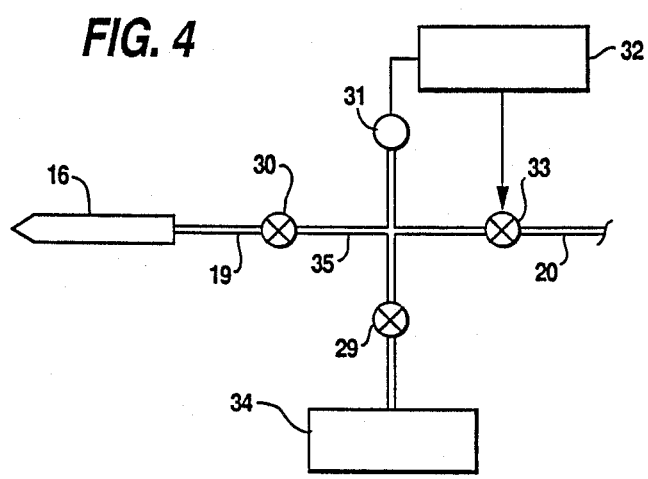
FIG. 4 is a supplemental drawing of a control chamber.

The control chamber 17 in FIG. 1 is a particular chamber for controlling the inside pressure. In another embodiment shown in FIG. 4, the pressure in the pipe 35, which is equivalent to the pipes 19 and 20 in FIG. 1, is measured by means of the vacuum gauge 31. The flow quantity of the etching gas 15, which is blown from the nozzle 16, is controlled by controlling the pressure in the pipe 35. The pipe 35 in FIG. 4 is equivalent to the control chamber 17 in FIG. 1.

Figure 5:
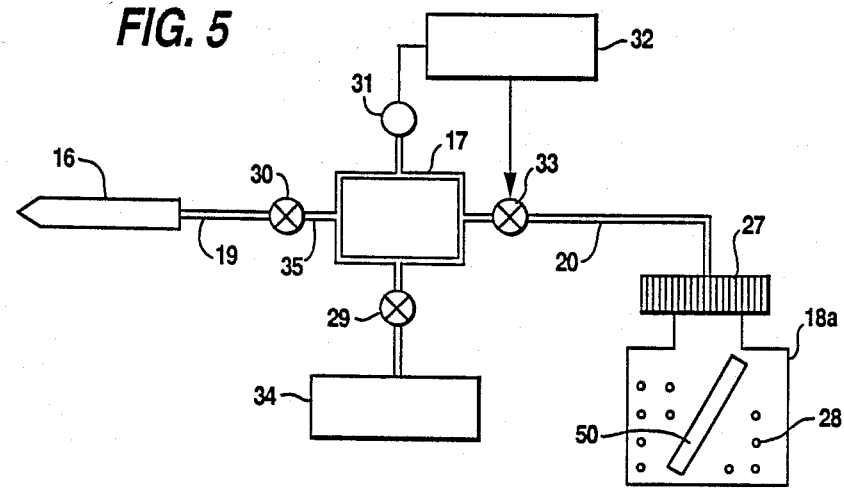
FIG. 5 is a partial supplemental drawing for explaining an embodiment of a gas injector using a permeator in a reservoir.
Figure 6:
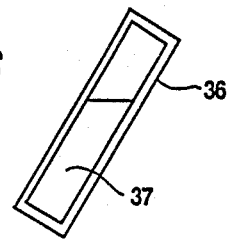
FIG. 6 is a sectional view for explaining a permeator.

With reference to FIG. 5 and FIG. 6, there is illustrated another embodiment of a gas injector wherein a permeator is used as the reservoir. FIG. 6 shows an example of a permeator 50. Numeral 36 is a cell. Numeral 37 is a concentrated etching material. The concentrated etching material 37 is fluid chlorine in the case where the etching gas is chlorine. The cell 36 is made of a resin such as PTFE (polytetrafluoroethylene). The enriched etching material 37 present in the cell 36 permeates and diffuses in and through the resin such that the etching gas is emitted from the surface of the cell 36. The permeators are commercially available as permeation tubes or diffusion tubes manufactured by Gastec Co. Ltd. FIG. 5 shows a gas injector in which the permeator 50 is used in the reservoir 18a. The reservoir 18a in FIG. 5 is a container in which the desiccant 28 and the permeator 50 are placed. The permeator 50 shown in FIG. 5 emits the etching gas 15, which is dried by the desiccant 28 in the reservoir 18a. The etching gas 15 emitted and dried in the reservoir 18a passes through the filter 27 having pores for filtering dust and reaches the variable flow quantity valve 33 through the pipe 20. Other parts of the gas injector are as described in connection with reference to FIG. 1. The operation of the gas injector and the flow quantity valve 33 are the same as described in connection with FIG. 1.

Figure 7:
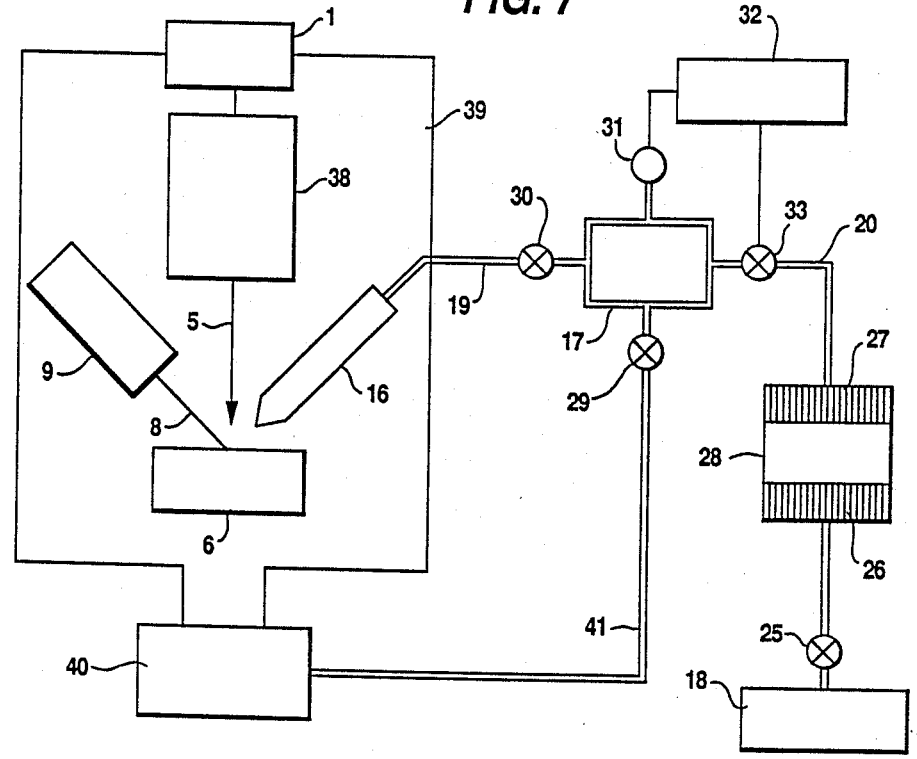
FIG. 7 and FIG. 8 are the explanatory arrangement drawing of embodiments for exhausting the control chamber.
Figure 8:
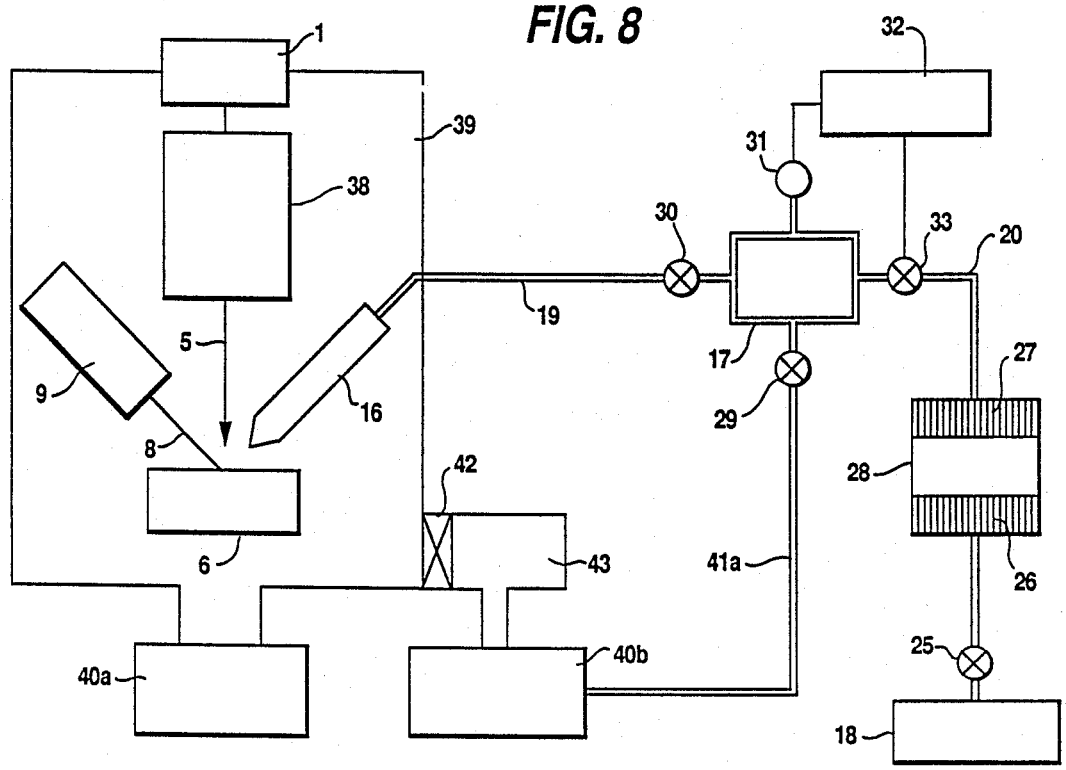

With reference to FIG. 7 and FIG. 8, there is illustrated an evacuation system suitable for use in repairing a pattern film with the apparatus of the present invention. In FIG. 7, numeral 38 is an ion optical system, numeral 39 is a sample space, numeral 40 is an evacuation system and numeral 41 is a pipe. The ion optical system 38 comprises the focusing lens 2, the blanking electrode 12, the scanning electrode 4, the objective lens 3, etc. The sample space 39 is a vacuum chamber, in which the ion optical system 38, the secondary charged particle detector 9, the sample 6, etc., are placed. The evacuation system 40 is an apparatus for keeping the inside pressure of the sample room 39 at $1\times10^{-4}$ Torr or less. In the embodiment of the present invention illustrated in FIG. 1, the position of the vacuum pump 34 is not described. In the case where the vacuum pump 34 of FIG. 1 is independent of the evacuation system 40 of FIG. 7, the apparatus becomes larger and the production cost becomes more expensive. In the present invention the control chamber 17 is evacuated by means of being connected to the evacuation system 40 through the valve 29 and the pipe 41 of FIG. 7 such that the size and cost of the apparatus are kept to a minimum.

Further embodiments for evacuation of the control chamber 17 of FIG. 8 are explained as follows. In FIG. 8, numeral 41a is a pipe, numeral 42 is a gate-valve and numeral 43 is an auxiliary chamber. The evacuation system 40a is an apparatus for keeping the inside pressure of the sample space 39 at $1\times10^{-4}$ Torr or less. The gate-valve 42 and the auxiliary chamber 43 are for taking the sample 6 in and out of the apparatus for repairing a pattern film. That is, when the sample 6 is to be in the apparatus, air is let into the auxiliary chamber 43 so that the pressure in the auxiliary chamber 43 becomes atmospherical. The sample 6 can then be inserted in the auxiliary chamber 43. The auxiliary chamber 43 is then evacuated, the gate-valve 42 is opened and the sample 6 is moved into a predetermined position within the sample room 39. When the sample 6 is to be taken out of the apparatus, the above operation is carried out in reverse order. The evacuation system 40b is an apparatus for evacuating the auxiliary chamber 43. In the embodiment of the invention illustrated in FIG. 8, the necessary evacuation of the control chamber 17 is obtained by evacuating the control chamber 17 through the valve 29 and the pipe 41a. Thus, the size increase of the apparatus and the cost increase are kept to a minimum. In the embodiment illustrated in FIG. 8, the gate-valve 42 is closed when the air is let in into the auxiliary chamber 43.

Figure 9:
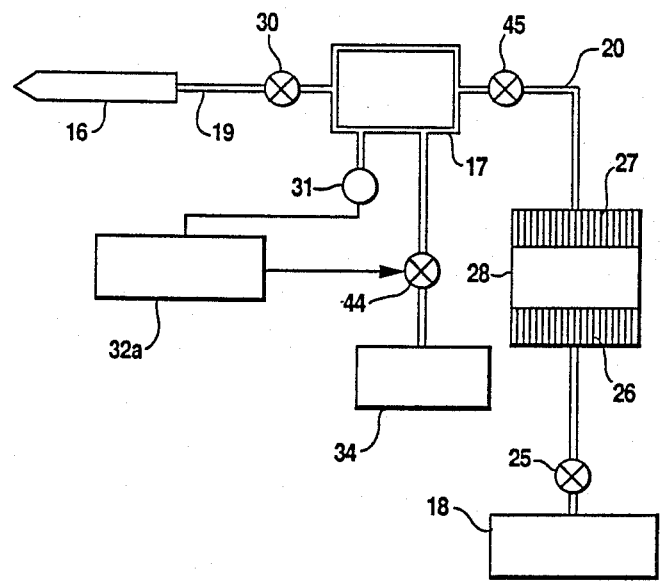
FIG. 9 is a partial supplemental drawing for explaining an embodiment of controlling the pressure in the control chamber.

With reference to FIG. 9, an explanation of another embodiment of the present invention is given as follows. In FIG. 9, the pressure of the etching gas in the control chamber 17 is controlled by means of fixing the supply of the etching gas which flows into control chamber 17 while the speed of evacuation of the control chamber 17 is variable. In FIG. 9 numeral 32a is a pressure controller, numeral 44 is the variable flow quantity valve and numeral 45 is a conductance valve. With reference to FIG. 9, the pressure in the control chamber 17 is controlled as follows. The quantity of the etching gas flowing into the control chamber 17 is controlled, through the conductance valve 45 which has a fixed conductance, in response to the pressure of the gas on the conductance valve 45 from the reservoir's side. The pressure in the control chamber 17 is detected by the vacuum gauge 31 connected to the control chamber 17 and pressure signals are transmitted from the vacuum gauge 31 to the pressure controller 32a. On basis of the pressure signals transmitted from the vacuum gauge 31, the pressure controller 32a calculates the difference between the pressure in the control chamber 17 and a predetermined pressure value, and the variation of the pressure in the control chamber 17 per unit hour. The pressure controller 32a then transmits to the variable flow quantity valve 44 signals for keeping the pressure in the control chamber 17 at the predetermined pressure. The variable flow quantity valve 44 varies the conductance relative to the signals transmitted from the pressure controller 32a so that the speed of evacuating the control chamber 17 is controlled. In this way the pressure in the control chamber 17 is controlled by means of balancing the quantity of the etching gas which flows into the control chamber 17. In the embodiment illustrated in FIG. 9, the reservoir 18 is a gas cylinder. In the case where the permeator shown in FIG. 5 and FIG. 6 is used in the reservoir, the same effect can be obtained as in the present embodiment.

When the sample comprises other materials, the composition of the etching gas may vary. Other suitable etching gases may comprise, for example, carbon tetrachloride, a mixture of carbon tetrachloride and oxygen, etc.

The present invention provides means for irradiating a scanning focused ion beam and for directing an etching gas to an excess portion of the pattern film, wherein the excess portion of the pattern film is removed. When chlorine is used as the etching gas, chlorine reacts with gallium irradiated as the ion beam, to produce volatile gallium chloride so that gallium does not remain on a substrate on which the pattern film is formed. The etching gas assisted by the ion beam reacts with the material of the pattern film, such that the material which is removed from the substrate is not redeposited at the fringe of the excess portion by sputter-deposition. Therefore, when the sample is photomask, reticle or X-ray mask, the repaired area has a high transparency. When the same ion beam can be used with other elements, the same effects are achieved by choosing a suitable etching gas.

By using an etching gas, the etched surface becomes perfectly smooth (hereinafter to be referred to as smooth etching) so that reduction of the transparency caused with diffused light does not occur.

By using an etching gas, secondary charged particles emitted from the sample surface are detected by means of a secondary charged particle detector without regard to whether a pattern film has an oxide-like layered film or not, when any element to be detected exists, the secondary ion intensity of the element is stabilized at a high level. Thus, it becomes easier to judge when removal of the excess portion of the pattern film is completed and the reliability of the removal is improved.

Without deteriorating the vacuum condition, the excess portion of the pattern film can be steadily repaired by means of providing an etching gas locally to the excess portion of the pattern film.

By means of providing filters and a desiccant in a gas injector and evacuating a control chamber by a turbomolecular pump, etc., a pure etching gas free of impurities can be supplied so that an excess portion of a pattern film can be repaired without being polluted by impurities.

By using a diaphragm type gauge as a vacuum gauge for detecting the pressure in the control chamber, the supply of the etching gas can be precisely controlled without damaging the vacuum gauge with the etching gas and without changing the quality of the etching gas.

We claim:

1. A method for repairing a pattern film, the steps of said method comprising:
    mounting a pattern film sample having an excess portion on a movable stage capable of movement in the X and Y directions;
    irradiating said excess portion with a scanning focused ion beam;
    directing an etching gas locally onto said excess portion while irradiating said excess portion with said scanning focused ion beam; and
    controlling the amount of etching gas directed locally onto said excess portion such that a relatively small amount of etching gas necessary to effectively remove said excess portion is directed locally onto said excess portion thereby preventing damage to other elements of the apparatus due to the presence of an excessive amount of said etching gas;
    wherein the excess portion is removed from said pattern film.

2. The method for repairing a pattern film as claimed in claim 1, wherein said sample is a photomask for producing a semiconductor.

3. The method for repairing a pattern film as claimed in claim 2, wherein the substrate of said photomask is glass, and said pattern film is a chromium film.

4. The method for repairing a pattern film as claimed in claim 2, wherein the substrate of said photomask is glass, and said pattern film is molybdenum film.

5. The method for repairing a pattern film as claimed in claim 1, wherein said sample is a reticle.

6. The method for repairing a pattern film as claimed in claim 1, wherein said sample is a X-ray mask.

7. The method for repairing a pattern film as claimed in claim 1, wherein said sample is a semiconductor.

8. The method for repairing a pattern film as claimed in claim 1, wherein said etching gas is chlorine.

9. The method for repairing a pattern film as claimed in claim 1, where in said etching gas is carbon tetrachloride.

10. The method for repairing a pattern film as claimed in claim 1, wherein said etching gas is a mixture of carbon tetrachloride and oxygen.

11. An apparatus for repairing a pattern film comprising; an ion source for emitting ions, an ion lens system for forming said ions into a focused ion beam, a scanning electrode adapted to irradiate a sample with said ion beam while scanning said sample with said ion beam, an XY stage on which the sample may be mounted, a secondary particle detector for detecting secondary particles emitted from the surface of said sample, an image display device for displaying a pattern of a pattern film formed on the sample surface on the basis of the planar intensity distribution of the secondary charged particles, and means for removing any excess portion of said pattern film by selectively irradiating the excess portion of said pattern film with the scanning focused ion beam repeatedly,
    characterized in that the apparatus further comprises directing means for locally directing an etching gas against said excess portion whereby the excess portion of said pattern film is selectively irradiated with the scanning focused ion beam while an etching gas which has a chemical etching effect on a material of said excess portion is locally directed against the position being irradiated with said scanning focused ion beam, wherein said directing means comprise: a nozzle; an etching gas source operably connected to a control chamber which is in turn operably connected to said nozzle; and a filter and a desiccant for filtering and drying the etching gas, said filter and desiccant being operably connected between said etching gas source and said control chamber.

12. The apparatus according to claim 11 including means for providing a pressure of the etching gas present in the control chamber within the range from about $1 \times 10^{-3}$ to about $2 \times 10^{-1}$ Torr during operation.

13. The apparatus according to claim 11 wherein the control chamber is a pipe.

14. An apparatus for repairing a pattern film, said apparatus comprising:
    a movable stage for movably mounting a sample having an excess portion;
    means for producing a scanning focused ion beam on said sample;
    a secondary particle detector for detecting secondary particles emitted from the surface of said sample when said sample is irradiated with said scanning focused ion beam;
    means for displaying a pattern of a pattern film formed on the sample surface on the basis of the planar intensity distribution of the secondary charged particles;
    means for directing an etching gas locally against said excess portion;
    a gas source operably connected to a desiccant and a filter which are in turn operably connected to control means for controlling the pressure of said etching gas, said control means being operably connected for supplying etching gas to said means for directing an etching gas; and
    means for removing said excess portion by selectively irradiating said excess portion with said scanning focused ion beam while directing said etching gas locally against the excess portion to be removed.

15. The apparatus according to claim 14 wherein the means for producing a scanning focused ion beam includes an ion source for emitting ions, an ion lens system for forming said ions into a focused ion beam, a scanning electrode adapted to irradiate said sample with said ion beam while scanning said sample with said ion beam, and a blanking electrode.

16. The apparatus according to claim 14 wherein the means for directing an etching gas locally against said excess portion comprises a thin-tubed nozzle configured to direct said etching gas generally on said excess portion to be removed but not generally against the remainder of said sample.

17. The apparatus according to claim 16 wherein the control means comprises:

a control chamber having operably attached thereto a vacuum gauge; and pressure control means responsive to said vacuum gauge for controlling the amount of said etching gas entering said control chamber.

18. The apparatus according to claim 17 wherein the gas source is a pressurized gas tank.

19. The apparatus according to claim 17 wherein the gas source is a permeator.

* * * * *